United States Patent
Chen et al.

(10) Patent No.: US 7,443,001 B2
(45) Date of Patent: Oct. 28, 2008

(54) PREPARATION OF MICROELECTROMECHANICAL SYSTEM DEVICE USING AN ANTI-STICTION MATERIAL AND SELECTIVE PLASMA SPUTTERING

(75) Inventors: Chien-Hua Chen, Corvallis, OR (US); Paul Felice Reboa, Corvallis, OR (US); Charles C. Haluzak, Corvallis, OR (US)

(73) Assignee: Helwett-Packard Development Company, L.P., Houston, TX (US)

( * ) Notice: Subject to any disclaimer, the term of this patent is extended or adjusted under 35 U.S.C. 154(b) by 19 days.

(21) Appl. No.: 11/541,993

(22) Filed: Oct. 2, 2006

(65) Prior Publication Data

US 2008/0108163 A1 May 8, 2008

(51) Int. Cl.
*H01L 21/00* (2006.01)
*H01L 21/302* (2006.01)

(52) U.S. Cl. .............. 257/414; 257/E21.218; 257/E29.324; 438/48; 438/50; 438/710; 438/778

(58) Field of Classification Search ............. 438/48, 438/127, 710, 778, 780; 257/E21.218
See application file for complete search history.

(56) References Cited

U.S. PATENT DOCUMENTS

| | | | |
|---|---|---|---|
| 5,573,679 A | 11/1996 | Mitchell et al. | |
| 6,335,224 B1 | 1/2002 | Peterson et al. | |
| 6,830,950 B2 | 12/2004 | Chinn et al. | |
| 6,902,947 B2 | 6/2005 | Chinn et al. | |
| 7,045,170 B1 | 5/2006 | Hankins et al. | |
| 7,087,456 B2 | 8/2006 | Gory et al. | |
| 2001/0003676 A1* | 6/2001 | Marks et al. | 438/710 |
| 2004/0003828 A1 | 1/2004 | Jackson | |
| 2005/0074919 A1* | 4/2005 | Patel et al. | 438/107 |
| 2005/0095833 A1* | 5/2005 | Lutz et al. | 438/597 |
| 2005/0109277 A1 | 5/2005 | Kobrin et al. | |
| 2005/0214462 A1 | 9/2005 | Kaeriyama et al. | |
| 2006/0076316 A1 | 4/2006 | Bollinger et al. | |
| 2006/0096705 A1 | 5/2006 | Shi et al. | |
| 2006/0205100 A1* | 9/2006 | Huang et al. | 438/20 |
| 2007/0026559 A1* | 2/2007 | Haluzak et al. | 438/50 |

* cited by examiner

*Primary Examiner*—Michelle Estrada
*Assistant Examiner*—Kevin A Parendo

(57) ABSTRACT

A method for preparing a microelectromechanical system (MEMS) device for subsequent processing is disclosed. The method includes establishing an anti-stiction material on exposed surfaces of the MEMS device. The exposed surfaces include at least an interior surface of a chamber and an external surface of the MEMS device. The anti-stiction material is selectively removed from at least a portion of the external surface via a plasma sputtering process under controlled conditions.

20 Claims, 2 Drawing Sheets

PREPARATION OF MICROELECTROMECHANICAL SYSTEM DEVICE USING AN ANTI-STICTION MATERIAL AND SELECTIVE PLASMA SPUTTERING

BACKGROUND

The present disclosure relates generally to microelectromechanical system devices and methods for preparing the same for subsequent processing.

Stiction may occur in microelectromechanical systems (MEMS) in two different forms: between the substrate and the microstructure(s) and/or between two or more microstructures when the system is in operation. Anti-stiction materials have been added to various surfaces in MEMS devices in an effort to prevent stiction from occurring.

Methods for establishing anti-stiction materials to a MEMS device are generally not selective. As such, any surface (i.e., inside and/or outside of the MEMS device) having an affinity for the anti-stiction material used is coated during the establishment process. While the presence of an anti-stiction coating may be desirable in some areas of the MEMS device, it may be undesirable in other areas. The presence of the anti-stiction material may be particularly undesirable in areas of the MEMS device where stiction is uncommon and/or that are exposed to subsequent processing steps.

BRIEF DESCRIPTION OF THE DRAWINGS

Features and advantages of embodiments of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiments of the method disclosed herein selectively remove anti-stiction materials from areas of a MEMS device where an anti-stiction material is undesirable. Such areas may include those subjected to subsequent processing steps and/or those where stiction is generally non-problematic. The devices prepared via embodiments of the methods disclosed herein advantageously have anti-stiction materials removed from surfaces that are suitable for bonding. The anti-stiction materials established on desirable surfaces of the MEMS device remain substantially intact during the selective removal process.

Figure 1:
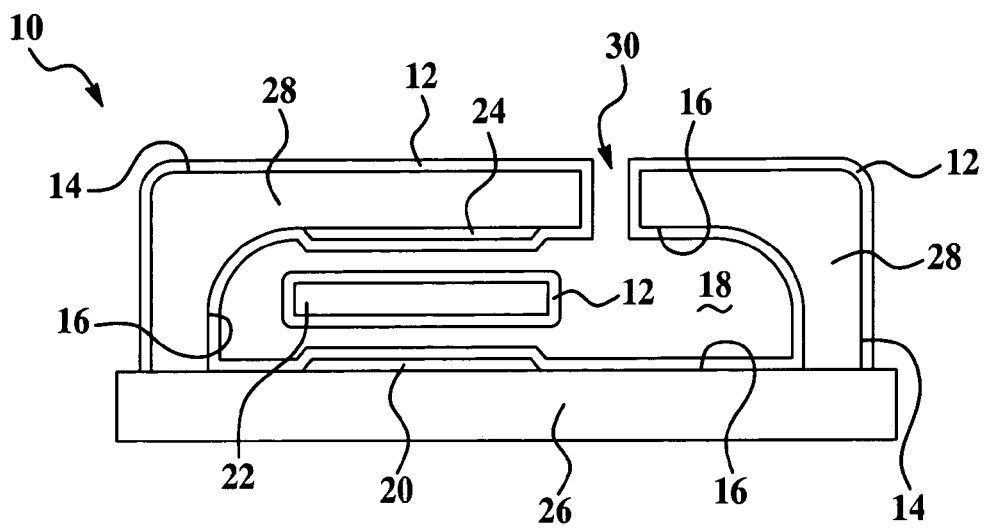
FIG. 1 is a schematic view of an embodiment of a MEMS device having an anti-stiction material established on an interior surface of a chamber and on an external surface of the MEMS device.

Referring now to FIG. 1, an embodiment of a MEMS device 10 is depicted with an anti-stiction material 12 established thereon. Non-limiting examples of such anti-stiction materials 12 include fluorinated linear long chain (greater than or equal to $C_6$) di- or tri-chlorosilanes (e.g., fluorinated decyl trichlorosilane (FDTS) and fluorinated octyl trichloro silane (FOTS)), fluorinated linear long chain (greater than or equal to $C_6$) di- or tri-dimethylaminosilanes (e.g., fluorinated decyl tris(dimethylamino)silane, perfluorooctanoic acid (PFOA), perfluorodecanoic acid (PFDA), perfluorooctylhydroxamic acid (PFOHXA), or the like, or combinations thereof.

Generally, the anti-stiction material 12 is established on exposed surfaces of the MEMS device 10. As used herein, the term "exposed surfaces" includes any surface of the MEMS device 10 (including surfaces of individual elements incorporated in the MEMS device 10) that is available for having a material established thereon. As non-limiting examples, such surfaces include external surfaces 14 of the device 10 and/or interior surfaces 16 of a chamber 18 of the device 10.

Generally, the technique(s) for establishing the anti-stiction material 12 is/are conformal, isotropic process(es). A non-limiting example of such a technique includes vapor deposition, liquid deposition, sublimation from a solid source, or the like. When a conformal process is used, generally any surface of the MEMS device 10 that has an affinity or spontaneity of bonding (i.e., change in Gibbs free energy<0) for the anti-stiction material 12 is coated. As previously described, the anti-stiction material 12 may be established on external surfaces 14 of the device 10 or interior surfaces 16 of the chamber 18.

As depicted in FIG. 1, additional elements 20, 22, 24 of the MEMS device 10 may also be coated with the anti-stiction material 12. The additional elements 20, 22, 24 of the device 10 may be moveable or non-movable components that provide function and/or structure to the device 10. Non-limiting examples of such elements 20, 22, 24 include electrode(s) 20, pixel plate(s) 22, and/or partial reflector layer(s) 24. In the embodiment shown in FIG. 1, the moveable component (e.g., pixel plate 22) is operatively disposed in the chamber 18 a spaced distance from both of the non-movable components (e.g., electrode 20 and partial reflector layer 24). Furthermore, the electrode 20 is disposed on a substrate 26, and opposed to the partial reflector layer 24, which is disposed on a portion of the interior surface 16 of the chamber 18. It is to be understood that other elements, in addition to, or as an alternate to those elements 20, 22, 24 shown and discussed herein, may be included in the MEMS device 10.

Referring still to FIG. 1, the MEMS device 10 may also include the previously mentioned substrate 26, upon which the materials 12, 28 (described further below) and elements 20, 22, 24 of the device 10 are operatively disposed. Examples of suitable substrate materials include, but are not limited to silicon, gallium arsenide, glass, fused silica, quartz, sapphire, or combinations thereof.

In an embodiment, a material 28 is also established on the substrate 26. Non-limiting examples of such a material 28 include tetra-ethyl-ortho-silicate (TEOS), silicon oxynitride, silicon nitride, silicon carbide, and/or the like. As depicted, the chamber 18 may be formed between the substrate 26 and the material 28, whereby the material 28 defines at least some of the interior surfaces 16 of the chamber 18, and the substrate 26 defines at least some other of the interior surfaces 16. Generally, the material 28 is established so that the chamber 18 has an opening 30 that allows the anti-stiction material 12 to enter the chamber 18.

The opening 30 may have any suitable size, depth, and lateral proximity to MEMS device 10. In an embodiment, the lateral proximity, size, and/or depth of the opening 30 may be selected to limit undesirable removal of the anti-stiction material 12 from within the chamber 18 (described further hereinbelow).

Figure 2:
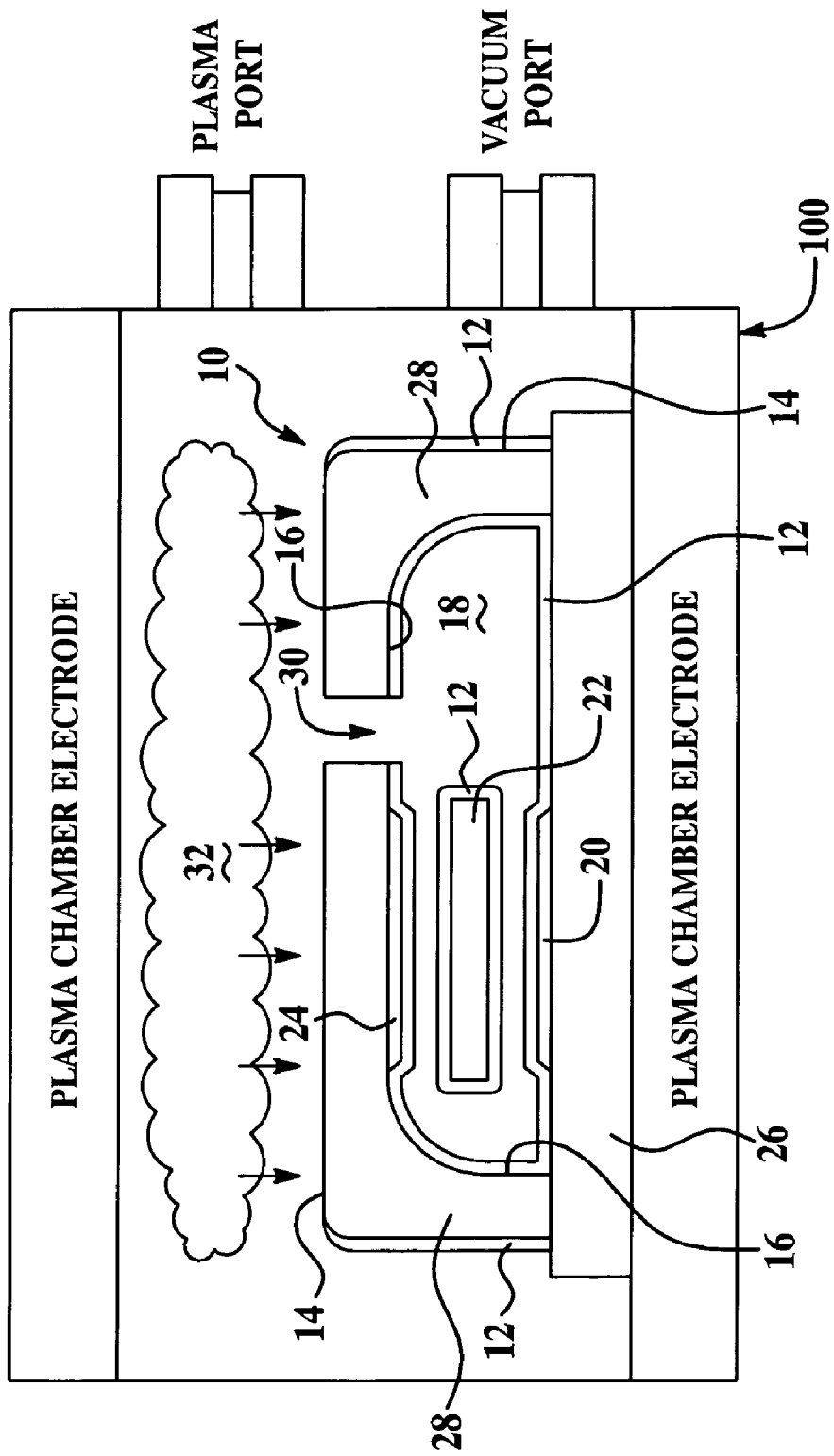
FIG. 2 is a schematic view of the MEMS device of FIG. 1 in a plasma chamber being exposed to an embodiment of the method disclosed herein.

Referring now to FIG. 2, an embodiment of the MEMS device 10 described in reference to FIG. 1 is shown in a plasma chamber 100. After the establishment of the anti-stiction material 12 on the exposed surfaces of the device 10, an embodiment of the method includes selectively removing the anti-stiction material 12 from at least a portion of the external surface 14 via a plasma sputtering process under controlled conditions.

As shown schematically in FIG. 2, the coated MEMS device 10 is exposed to a plasma sputtering process in the plasma chamber 100. The plasma sputtering process is selected from a direct low frequency argon plasma sputtering process, a direct low frequency nitrogen plasma sputtering process, and an oxygen plasma sputtering process, and/or combinations thereof. Each of the plasma sputtering processes results in the formation of a plasma 32 that reacts with and removes the anti-stiction material 12 from at least a portion of the external surface 14. Examples of the controlled processing conditions include plasma frequency, gas flow rate, plasma chamber electrode bias voltage, type of process gas, time of exposure to the plasma sputtering process, and combinations thereof.

The plasma sputtering process generates highly reactive, charged species and free-radicals. These species and free-radicals act to decompose and remove organics from those surface(s) with which they come in contact. Decomposition may occur via repeated chemical attack and rearrangement, or via physical bombardment, whereby the molecules are shattered apart. Generally, removal may be monitored via measuring the contact angle. It is believed that when a surface with an FDTS anti-stiction coating and a contact angle of 115° is placed in a plasma field as described herein, the contact angle will quickly decrease to an unmeasurable level (e.g., less than 50) within about 15-30 seconds of plasma exposure. This indicates a clean surface, without any anti-stiction material present.

It is to be understood that each of the plasma sputtering processes is to be performed under controlled conditions so that selective removal of the anti-stiction material 12 from at least a portion of the external surface 14 is accomplished, and so that the anti-stiction material 12 established on the interior surfaces 16 of the chamber 18 (and on any elements 20, 22, 24 disposed therein) remains substantially intact. The plasma conditions are also controlled so that the plasma is sufficient to chemically prepare the external surface 14 for subsequent bonding processes, but not sufficient to substantially remove the anti-stiction material 12 established on the interior surfaces 16. Examples of the controlled processing conditions include plasma frequency, gas flow rate, plasma chamber electrode bias voltage, type of process gas, time of exposure to the plasma sputtering process, and combinations thereof.

As used herein, the phrase "remains substantially intact" means that most of anti-stiction material 12 established on the interior surfaces 16 (and on elements 20, 22, 24 disposed within the chamber 18) is unaffected by the selective removal process. It is to be understood, however, that the opening 30 does allow at least some of the plasma gas to enter the chamber 18 in the Z-direction (i.e. in a direction generally perpendicular to the placement of MEMS device 10). Generally, surfaces 16 and elements (e.g., 20, 22, 24) positioned directly opposed to the opening 30 and/or within about 10 microns away from an edge of the opening 30 may be subjected to the plasma gas, including energetic ions. This may undesirably remove the anti-stiction coating 12 established on those surfaces 16 and elements (e.g., 20, 22, 24) positioned inside the chamber 18 directly opposed to the opening 30 and/or within about 10 microns of the edge(s) of opening 30. To ensure that the anti-stiction coating 12 within the chamber 18 is not undesirably removed, the coated elements 20, 22, 24 are generally positioned at least about 10 microns away from the edge(s) of opening 30. In a non-limiting embodiment, the coated elements 20, 22, 24 are positioned from about 10 microns to about 100 microns away from the edge(s) of the opening 30. It is to be understood that the above range of distances from the edge(s) of opening 30 is given as a non-limiting example. As such, it is to be further understood that other suitable distances/configurations of MEMS placement relative to opening 30 are contemplated as being within the purview of the present disclosure. A desirable placement includes one that is spaced far enough from opening 30 so as to substantially avoid undesirable removal of anti-stiction coating 12, yet not so far as to unnecessarily waste valuable space on the substrate 26 surface.

As previously stated, the plasma gas enters the chamber 18 through the opening 30 in the Z-direction. In the embodiments depicted in FIGS. 2 and 3, the substrate 26 provides a substantially straight "floor" for the chamber 18. This type of "floor" then enables a relatively straight lateral path for the plasma gas once it enters the chamber 18. In this embodiment (as previously described), the plasma gas may undesirably remove the anti-stiction coating 12 within about 10 microns of the edge(s) of opening 30.

Figure 3:
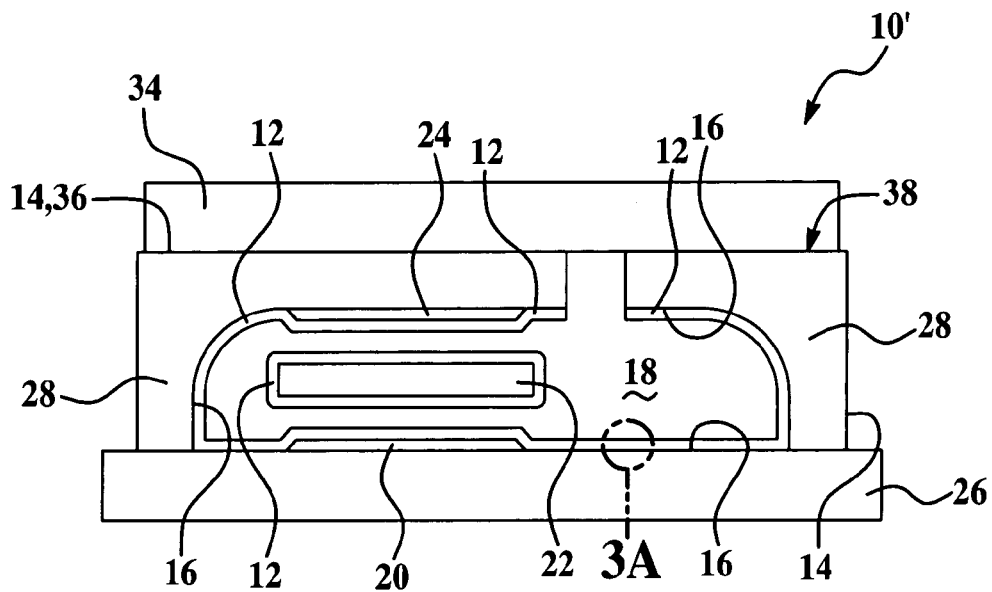
FIG. 3 is a schematic view of the MEMS device of FIG. 1 after selective removal of the anti-stiction material and bonding of a sealing member.
Figure 3A:
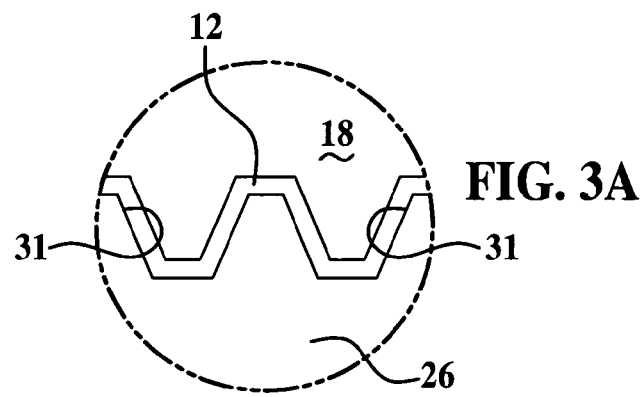
FIG. 3A is a schematic view of the area shown at circle 3A in FIG. 3, of a tortuous path defined in a substrate having the anti-stiction material established thereon.

As depicted in FIG. 3A, the "floor" of the chamber 18 (particularly the portion substantially directly opposed to the opening 30) and/or other areas of the material 28 near or connected to the opening 30 may be modified to have a labyrinthine or tortuous path 31 defined therein, thereby providing additional "walls" with which the plasma gas collides. Without being bound to any theory, it is believed that this may assist in destroying the energetic ions of the plasma gas and increasing the diffusion length, hence time available, for reactive species to migrate toward the MEMS, thereby reducing the amount of anti-stiction coating 12 that is undesirably removed from within the chamber 18. FIG. 3A is a schematic representation of the tortuous path 31 defined in the substrate 26. It is to be understood, however, that the tortuous path 31 may be defined in the material 28, in addition to or as an alternative to being defined in the substrate 26. Generally, if the tortuous path 31 is present, it may be defined proximate, adjacent, and/or opposed to the opening 30. Furthermore, the tortuous path 31 may have any desirable size, shape and/or configuration.

Generally referring back to FIG. 2, in an embodiment of the method in which the direct low frequency argon plasma sputtering process or the direct low frequency nitrogen sputtering process is selected, the controlled conditions include plasma frequency, plasma chamber electrode bias voltage, and exposure time. Generally, in order to achieve selective removal of the anti-stiction material 12 using either of these sputtering processes, the plasma frequency ranges from about 40 KHz to about 400 KHz, the bias voltage ranges from about 50 volts to about 200 volts, and the time of exposure ranges from about 20 seconds to about 60 seconds. In a non-limiting example, the plasma frequency is about 40 KHz, the bias voltage is about 100 volts, and the time of exposure is about 40 seconds.

In an embodiment of the method in which the oxygen plasma sputtering process is selected, the controlled conditions include plasma flow, plasma chamber electrode bias voltage, and exposure time. Generally, in order to achieve selective removal of the anti-stiction material 12 using this sputtering process, gas flow ranges from about 10 sccm to about 100 sccm, the bias voltage ranges from about 20 volts to about 100 volts, and the time of exposure is less than about 1 minute. In a non-limiting example, the plasma flow is about 100 sccm, the bias voltage is about 100 volts, and the time of exposure is less than about 60 seconds.

It is to be understood that when a combination of plasma sputtering processes is used, the controlled conditions may be altered, as desirable and/or suitable, to accommodate each of the different processes. The conditions are generally altered to substantially prevent removal of the anti-stiction material 12 from within the chamber 18. As a non-limiting example, a 30 second Ar plasma may be used to strip the anti-stiction coating 12 from external surfaces 14 (e.g., a bonding surface), and an additional 20 second $N_2$ plasma may be used to activate the external surface 14, thereby providing the surface 14 with a relatively high surface energy.

Referring now to FIG. 3, an embodiment of the MEMS device 10' is shown after being subjected to the plasma sputtering process previously described, and after subsequent processing steps have been performed.

In an embodiment, at least a portion of the external surface 14 from which the anti-stiction material 12 is removed is a bonding surface 36. In this embodiment, the subsequent processing step(s) may include bonding a sealing member 34 (e.g., a glass material) to the bonding surface 36. The sealing member 34 may be formed of any suitable hermetic material, or any material having desirable properties for the MEMS device 10, 10' (such as, for example, specific transmission or blocking of electromagnetic radiation, heat flux, and/or the like). Bonding may be accomplished by plasma-assisted bonding, silicate bonding, or any other bonding process that meets the packaging requirements.

FIG. 3 further depicts an embodiment of the MEMS device 10' including the bonded sealing member 34, and the interface 38 formed between the bonded materials 28, 34. It is to be understood that bonding the sealing member 34 to the bonding surface 36 may result in a hermetically sealed MEMS device 10'. The sealing member 34 may also assist in protecting the elements 20, 22, 24 within the chamber 18.

The MEMS device 10, 10' disclosed herein may be operatively disposed in another device or package (e.g., package-in-package (PIP)). The device may be an electronic device, a sensing device, a display device, an optical switching device, or combinations thereof.

Embodiments of the method disclosed herein advantageously allow for the selective removal of anti-stiction materials 12 from areas of a MEMS device 10, 10' that are subjected to subsequent processing steps and/or where stiction is generally non-problematic. The anti-stiction materials 12 established on desirable surfaces (e.g., inside of chamber 18) of the MEMS device 10, 10' advantageously remain intact during the selective removal process.

While several embodiments have been described in detail, it will be apparent to those skilled in the art that the disclosed embodiments may be modified. Therefore, the foregoing description is to be considered exemplary rather than limiting.

What is claimed is:

1. A method for preparing a microelectromechanical system (MEMS) device for subsequent processing, the method comprising:
    defining a tortuous path in and along at least a portion of an interior surface of a chamber that is adjacent to a chamber opening through which an anti-stiction coating material is established on an interior surface of the chamber;
    establishing the anti-stiction material on exposed surfaces of the microelectromechanical system device, the exposed surfaces including at least the interior surface of the chamber and an external surface of the MEMS device; and
    selectively removing the anti-stiction material from at least a portion of the external surface via a plasma sputtering process under controlled conditions.

2. The method as defined in claim 1 wherein the at least a portion of the external surface is a bonding surface.

3. The method as defined in claim 2 wherein the subsequent processing includes bonding a sealing member to the bonding surface after the anti-stiction material is selectively removed, thereby hermetically sealing the chamber.

4. The method as defined in claim 1 wherein the plasma sputtering process is selected from a direct low frequency argon plasma sputtering process, a direct low frequency nitrogen plasma sputtering process, an oxygen plasma sputtering process, and combinations thereof.

5. The method as defined in claim 4 wherein the controlled conditions are selected from plasma frequency, gas flow rate, plasma chamber electrode bias voltage, type of process gas, time of exposure to the plasma sputtering process, and combinations thereof.

6. The method as defined in claim 5 wherein the plasma sputtering process is accomplished via the direct low frequency argon plasma sputtering process, and wherein the plasma frequency ranges from about 40 KHz to about 400 KHz, the bias voltage ranges from about 50 volts to about 200 volts, and the time of exposure ranges from about 20 seconds to about 60 seconds.

7. The method as defined in claim 5 wherein the plasma sputtering process is accomplished by the direct low frequency nitrogen plasma sputtering process, and wherein the plasma frequency ranges from about 40 KHz to about 400 KHz, the bias voltage ranges from about 50 volts to about 200 volts, and the time of exposure ranges from about 20 seconds to about 60 seconds.

8. The method as defined in claim 5 wherein the plasma sputtering process is accomplished via the oxygen plasma sputtering process, and wherein the gas flow ranges from about 10 sccm to about 100 sccm, the bias voltage ranges from about 20 volts to about 100 volts, and the time of exposure is less than about 1 minute.

9. The method as defined in claim 1 wherein the anti-stiction material established on the interior surface of the chamber remains substantially intact after selective removal of the anti-stiction material from the at least a portion of the external surface.

10. The method as defined in claim 1 wherein at least one moveable component is located within the chamber at least a predetermined distance from a chamber opening, and wherein the anti-stiction material is established on the at least one moveable component.

11. A microelectromechanical system (MEMS) device, comprising:
    a substrate;
    a material established on the substrate, the material having an external surface, and defining at least a portion of an interior surface of a chamber formed between the substrate and the material;
    at least one moveable component operatively disposed in the chamber;
    a chamber opening defined in the material;
    a tortuous path defined in and along at least a portion of the interior surface adjacent to the chamber opening;

an anti-stiction material established on the interior surface and on the at least one moveable component; and a bonding surface forming at least a portion of the external surface, the bonding surface having had the anti-stiction material established thereon and subsequently removed via a plasma sputtering process under controlled conditions.

12. The device as defined in claim 11, wherein the at least one moveable component is operatively disposed in the chamber at least a predetermined distance from the chamber opening.

13. The device as defined in claim 11, further comprising an electrode established on the substrate and in the chamber a spaced distance from the at least one moveable component, wherein the electrode has the anti-stiction material established thereon.

14. The device as defined in claim 13, further comprising a partial reflector layer established on the interior surface the spaced distance from the at least one moveable component and opposed to the electrode, wherein the partial reflector layer has the anti-stiction material established thereon.

15. The device as defined in claim 11, further comprising a sealing member bonded to the bonding surface.

16. A method for using the device of claim 11, the method comprising bonding a sealing member to the bonding surface, thereby hermetically sealing the MEMS device.

17. The method as defined in claim 16, further comprising operatively disposing the sealed MEMS device in an electronic device, a sensing device, a display device, an optical switching device, or combinations thereof.

18. The method as defined in claim 16 wherein the sealing member is formed of a hermetic material.

19. The device as defined in claim 11 wherein the tortuous path is configured in a floor of the chamber.

20. The device as defined in claim 11 wherein the tortuous path is configured to provide additional walls of the interior surface of the chamber.

* * * * *

UNITED STATES PATENT AND TRADEMARK OFFICE
CERTIFICATE OF CORRECTION

PATENT NO. : 7,443,001 B2 Page 1 of 1
APPLICATION NO. : 11/541993
DATED : October 28, 2008
INVENTOR(S) : Chien-Hua Chen et al.

It is certified that error appears in the above-identified patent and that said Letters Patent is hereby corrected as shown below:

On the Title Pg. Item (73) in "Assignee", line 1, delete "Helwett-Packard" and insert -- Hewlett-Packard --, therefor.

In column 3, line 37, delete "50" and insert -- 5° --, therefor.

Signed and Sealed this

Seventeenth Day of March, 2009

JOHN DOLL
*Acting Director of the United States Patent and Trademark Office*